(12) United States Patent
Okamoto et al.

(10) Patent No.: US 9,012,927 B2
(45) Date of Patent: Apr. 21, 2015

(54) DISPLAY DEVICE

(71) Applicant: Canon Kabushiki Kaisha, Tokyo (JP)

(72) Inventors: Kaoru Okamoto, Chiba (JP); Shigeru Kido, Mobara (JP); Manabu Otsuka, Narashino (JP); Nobuhiko Sato, Mobara (JP)

(73) Assignee: Canon Kabushiki Kaisha, Tokyo (JP)

( * ) Notice: Subject to any disclaimer, the term of this patent is extended or adjusted under 35 U.S.C. 154(b) by 25 days.

(21) Appl. No.: 13/669,864

(22) Filed: Nov. 6, 2012

(65) Prior Publication Data
US 2013/0134452 A1 May 30, 2013

(30) Foreign Application Priority Data

Nov. 30, 2011 (JP) ................................. 2011-262265

(51) Int. Cl.
*H01L 51/52* (2006.01)
*H01L 27/32* (2006.01)

(52) U.S. Cl.
CPC ......... *H01L 51/5209* (2013.01); *H01L 27/3244* (2013.01); *H01L 51/5218* (2013.01); *H01L 2251/5315* (2013.01); *H01L 2251/5392* (2013.01)

(58) Field of Classification Search
CPC ............ H01L 51/5088; H01L 51/5203; H01L 51/5218; H01L 51/5228; H01L 51/5234; H01L 2227/323; H01L 27/3244
USPC .......... 257/40, 72, 89, 98, 347; 438/149, 151, 438/29, 585, 99
See application file for complete search history.

(56) References Cited

U.S. PATENT DOCUMENTS

| | | | |
|---|---|---|---|
| 7,294,962 B2 * | 11/2007 | Kim et al. ...................... | 313/504 |
| 8,461,592 B2 * | 6/2013 | Ha et al. ........................... | 257/59 |
| 2005/0116623 A1 * | 6/2005 | Kim et al. ...................... | 313/504 |
| 2005/0230752 A1 * | 10/2005 | Kanno et al. .................. | 257/347 |
| 2007/0071885 A1 * | 3/2007 | Kumagai ......................... | 427/66 |
| 2011/0156079 A1 * | 6/2011 | Nakatani et al. ................ | 257/98 |

FOREIGN PATENT DOCUMENTS

| | | |
|---|---|---|
| JP | 2003-332082 A | 11/2003 |
| JP | 2005-327694 A | 11/2005 |

* cited by examiner

*Primary Examiner* — Zandra Smith
*Assistant Examiner* — Jaehwan Oh
(74) *Attorney, Agent, or Firm* — Fitzpatrick, Cella, Harper & Scinto

(57) ABSTRACT

Provided is a display device including: a substrate; and multiple pixels provided on the substrate, the pixels each having an organic EL element obtained by laminating a lower electrode provided on the substrate, an organic compound layer, and an upper electrode in the stated order, and the lower electrode including an electrode independently placed for each of the pixels, in which: the lower electrode is formed of a first lower electrode layer provided on the substrate and a second lower electrode layer provided on the first lower electrode layer; the organic compound layer and the upper electrode cover the first lower electrode layer and the second lower electrode layer; and charge injection property from the second lower electrode layer into the organic compound layer is larger than charge injection property from an end portion of the first lower electrode layer into the organic compound layer.

9 Claims, 3 Drawing Sheets

DISPLAY DEVICE

BACKGROUND OF THE INVENTION

1. Field of the Invention

The present invention relates to a display device, in particular, an organic electroluminescence (EL) display device including an organic EL element.

2. Description of the Related Art

In recent years, an organic EL display device including an organic EL element as a self-luminous device has been attracting attention as a flat-panel display. Here, the organic EL element is an electronic element having a pair of electrodes and an organic compound layer placed between the pair of electrodes, and the organic EL display device is a display device using the organic EL element as a display element.

In a top-emission type display device, a lower electrode to be provided closer to a substrate side with respect to an organic compound layer is required to have a high reflectance for improving the light extraction efficiency of the device. A metal material having a high reflectance such as aluminum or silver is used as a material for the lower electrode, and the material is formed into a layer having a thickness of 30 nm or more in order that the reflectance intrinsic to the material may be obtained. When an organic EL element is formed by laminating the organic compound layer and an upper electrode on the lower electrode having a thickness of 30 nm or more, the organic compound layer becomes thin at end portions of the lower electrode (referring to an upper end portion, a lower end portion, and a side wall portion). The application of a voltage between the lower electrode and upper electrode of such organic EL element causes a phenomenon in which a current concentrates on an end portion of the lower electrode. As a result, the following problem arises. The emission intensity of the organic compound layer at the end portion becomes larger than its emission intensity at a flat portion except the end portion, and hence local brightness unevenness occurs in the same light-emitting pixel.

Several methods have heretofore been proposed as methods for solving the problem. Japanese Patent Application Laid-Open No. 2003-332082 discloses a display device in which all upper end portions of lower electrodes are roundly chamfered so that an electric field may not concentrate in the upper end portions. In addition, Japanese Patent Application Laid-Open No. 2005-327694 discloses a display device in which a side surface of a lower electrode is tilted by processing an upper end portion of the lower electrode into a taper shape.

However, even in the case where an upper end portion of a lower electrode is processed like Japanese Patent Application Laid-Open No. 2003-332082 and Japanese Patent Application Laid-Open No. 2005-327694, as in the case where the upper end portion is not processed, the thickness of an organic compound layer to be formed on the lower electrode tends to be smaller at the upper end portion than at a flat portion as the upper surface of the lower electrode. Accordingly, such a tendency that a current is more likely to concentrate in the upper end portion of the lower electrode than in the flat portion of the lower electrode does not change. In addition, the concentration of the current in the upper end portion of the lower electrode makes the emission intensity of the layer at the upper end portion larger than its emission intensity at the flat portion of the lower electrode. Accordingly, the problem of the local brightness unevenness in the same light-emitting pixel still remains.

In addition, the current efficiency and chromaticity of an organic EL element largely change depending on the thickness of an organic compound layer constituting the element. Accordingly, when the thickness of the organic compound layer to be formed on a lower electrode is not uniform owing to the state of the lower electrode, actually causing a current to flow through the organic compound layer may cause a reduction in luminous efficiency of the element or the deterioration of its color purity.

SUMMARY OF THE INVENTION

The present invention has been made to solve the problems and an object of the present invention is to provide a display device whose luminous efficiency and color purity are improved.

A display device of the present invention includes: a substrate; and multiple pixels provided on the substrate, the pixels each having an organic EL element obtained by laminating a lower electrode provided on the substrate, an organic compound layer, and an upper electrode in the stated order, and the lower electrode including an electrode independently placed on the substrate for each of the pixels, in which: the lower electrode includes a first lower electrode layer provided on the substrate and a second lower electrode layer provided in a region on the first lower electrode layer, the region avoiding an end portion; the organic compound layer and the upper electrode cover the first lower electrode layer and the second lower electrode layer; and charge injection property from the second lower electrode layer into the organic compound layer is larger than charge injection property from the end portion of the first lower electrode layer into the organic compound layer.

According to the present invention, it is possible to provide the display device whose luminous efficiency and color purity are improved. That is, the display device of the present invention is such that the charge injection property from the first lower electrode layer constituting the lower electrode into the organic compound layer is smaller than the charge injection property from the second lower electrode layer into the organic compound layer. As a result, a current can be made hard to flow in an end portion of the lower electrode where the first lower electrode layer and the organic compound layer are in contact with each other.

In addition, the use of a material having large charge injection property into the organic compound layer as a constituent material for the second lower electrode layer can facilitate the flow of a current in the flat portion of the lower electrode (a region where the thickness of the lower electrode is substantially constant).

Therefore, more uniform light emission than that of the related art can be obtained irrespective of the thickness of a lower electrode in a light-emitting pixel and the shape of an end portion thereof.

Further features of the present invention will become apparent from the following description of exemplary embodiments with reference to the attached drawings.

DESCRIPTION OF THE EMBODIMENTS

Preferred embodiments of the present invention will now be described in detail in accordance with the accompanying drawings.

A display device of the present invention includes a substrate and multiple pixels provided on the substrate. In the display device of the present invention, the pixels each have an organic EL element obtained by laminating a lower electrode provided on the substrate, an organic compound layer, and an upper electrode in the stated order. Here, the lower electrode is an electrode independently placed on the substrate for each pixel.

By the way, in the display device of the present invention, the lower electrode includes a first lower electrode layer provided on the substrate and a second lower electrode layer provided in a region in an upper surface on the first lower electrode layer, the region avoiding an end portion. The first lower electrode layer is a layer (reflecting layer) for reflecting light emitted in the organic compound layer toward the light output side of the display device, and is formed to have a thickness of nm or more so that the reflectance intrinsic to its material may be obtained. The second lower electrode layer is a layer for securing charge injection property from a lower electrode 21 into an organic compound layer 22. Here, the organic compound layer and the upper electrode constituting the organic EL element cover the first lower electrode layer and the second lower electrode layer. Therefore, the charge injection property of the first lower electrode layer is made small so that a reduction in thickness of the organic compound layer in an end portion of the first lower electrode layer may not affect display quality. In addition, the thickness of the second lower electrode layer is preferably as small as possible in order that a region where the thickness of the organic compound layer reduces in an end portion of the second lower electrode layer having high charge injection property may be reduced. It should be noted that the end portion in the present invention is a concept comprehending the upper end portion and lower end portion of a layer of interest, and a side wall between the upper end portion and the lower end portion.

In view of the foregoing, in the present invention, the charge injection property from the second lower electrode layer into the organic compound layer is made larger than the charge injection property from the first lower electrode layer into the organic compound layer.

Hereinafter, embodiments of the present invention are described with appropriate reference to drawings. It should be noted that a known or well-known technology in the technical field of the present invention is applicable to a portion not particularly described in the following description or a portion not illustrated in any drawing. In addition, the embodiments to be described below are merely examples of embodiments and the present invention is not limited to these embodiments.

(1) First Embodiment

Figure 1:
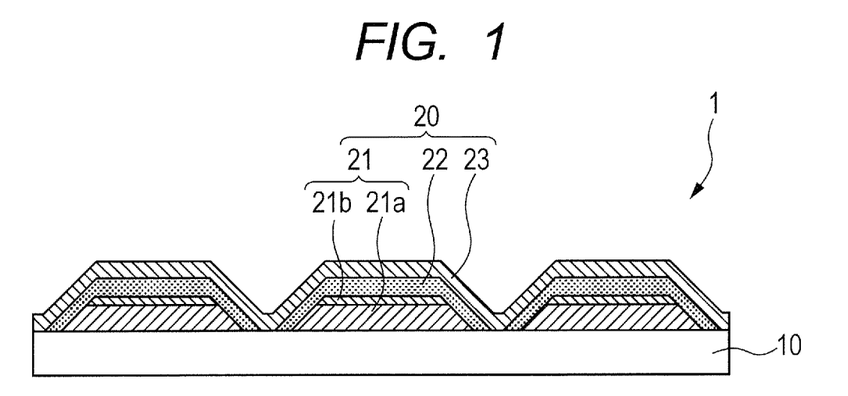
FIG. 1 is a schematic sectional view illustrating a display device according to First Embodiment of the present invention.

FIG. 1 is a schematic sectional view illustrating a display device according to First Embodiment of the present invention. A display device 1 of FIG. 1 includes, on a substrate 10, multiple (three) organic EL elements 20 each constituted of the lower electrode 21 provided on the substrate 10, the organic compound layer 22, and an upper electrode 23. In the display device 1 of FIG. 1, the lower electrode 21 is provided by laminating a first lower electrode layer 21a and a second lower electrode layer 21b from a side closer to the substrate 10 in the stated order.

By the way, the display device 1 of FIG. 1 is an organic EL display device having the organic EL elements 20, but in the present invention, the display elements constituting the display device may be changed to light-emitting elements except the organic EL elements 20 such as inorganic EL elements.

Next, a constituent layer for the display device 1 of FIG. 1 is described.

Any substrate can be used as the substrate 10 without any particular limitation as long as the substrate enables stable production of the display device including the organic EL elements 20 and the driving thereof. An insulative substrate such as glass or an Si wafer is suitable.

A driver circuit for driving each organic EL element 20 provided for the display device may be provided on the substrate 10 as required. Here, when the driver circuit is provided on the substrate 10, it is recommended that an insulative planarizing layer or the like be provided on the driver circuit as required for planarizing unevenness caused by the provision of the driver circuit. It should be noted that the lower electrode 21 is formed on the surface of a layer formed of an insulating material irrespective of whether the driver circuit is provided on the substrate 10.

As illustrated in FIG. 1, the lower electrode 21 is constituted so as to be of such a form that two electrode layers, specifically, the first lower electrode layer 21a and the second lower electrode layer 21b are laminated in the stated order.

As described above, the lower electrode 21 has at least the first lower electrode layer 21a and the second lower electrode layer 21b, provided that an intervening layer can be provided between the substrate 10 and the first lower electrode layer 21a or between the first lower electrode layer 21a and the second lower electrode layer 21b according to any other purpose. In addition, one of the two electrode layers (21a and 21b) can be constituted of a layer formed of multiple layers. For example, the first lower electrode layer 21a including an adhesion layer formed of ITO, Mo, or the like on a side in contact with the substrate 10 may be formed so that peeling may not occur between the substrate 10 and the lower electrode 21.

The lower electrode 21 can be formed by utilizing, for example, a photolithography process. Specifically, the electrode is formed by the following steps (a) to (c):

(a) forming electrode layers in which the first lower electrode layer and the second lower electrode layer are laminated on the substrate 10 by known means such as a sputtering method or a vapor deposition method;

(b) applying a photoresist onto the electrode layers, and exposing and developing the applied photoresist to form a pattern of the photoresist; and (c) performing etching according to the formed pattern of the photoresist to remove the electrode layers at a portion where the photoresist has been removed.

The lower electrode 21 can be separately formed for each pixel through the steps (a) to (c). It should be noted that the number of times of etching to be performed in the step (c) can be set to one. Specifically, when constituent materials for the respective layers (21a and 21b) constituting the lower electrode can be etched under a common etching condition, the number of etching steps can be set to one.

By the way, in the present invention, the respective end portions of the two electrode layers (21a and 21b) constituting the lower electrode 21 preferably improve a state where the layer side walls of the two electrode layers (21a and 21b) constituting the lower electrode 21 are covered with the organic compound layer 22 in order that a short circuit caused by contact between the lower electrode and the upper electrode may be prevented. To this end, each of the sectional shapes of the respective electrode layers (21a and 21b) is a sectional shape having a taper as illustrated in FIG. 1.

Meanwhile, in the present invention, the two electrode layers (21a and 21b) constituting the lower electrode 21 are different from each other in charge injection property into the organic compound layer 22. Specifically, the second lower electrode layer 21b has larger and better charge injection property into the organic compound layer 22 than that of the first lower electrode layer 21a. As a result, charge injected from the lower electrode 21 into the organic compound layer 22 is selectively injected from the second lower electrode layer 21b.

Here, several kinds were selected from metal materials to be utilized as electrode materials, and then organic EL elements were produced by using the selected metal materials as constituent materials for lower electrodes each formed of a single layer. In the organic EL elements, a layer formed of any such metal material serving as the lower electrode was formed on a substrate, and then the lower electrode was divided for each element in the air by a photolithography process. An organic compound layer capable of emitting blue light and an upper electrode formed of a transparent electrode material were subsequently formed on the entirety of the top of the substrate on which the divided lower electrodes had been formed. Table 1 below shows a voltage needed to drive the resultant organic EL element 20 at a current density of 25 mA/cm$^2$ and the reflectance of each material.

TABLE 1

| Metal material (electrode material) | Driving voltage at 25 mA/cm$^2$ [V] | Reflectance at 460 nm [%] |
| --- | --- | --- |
| Al | 6.5 | 92 |
| AlNd | 6.7 | 91 |
| AlY | 6.9 | 90 |
| AlSi | 4.2 | 88 |
| AlPt | 4.4 | 85 |
| AlNi | 4.4 | 88 |
| Mo | 3.7 | 70 |
| W | 4.0 | 65 |

By the way, the magnitude of the charge injection property of an electrode is determined by the magnitude of the voltage needed to drive the organic EL element 20, i.e., the driving voltage. In other words, a smaller driving voltage means that the charge injection property is larger, and in contrast, a larger driving voltage means that the charge injection property is smaller. When the lower electrode is a reflecting electrode, a metal material to be used as a constituent material for the lower electrode 21 preferably has as high a reflectance as possible for the peak wavelength of light emitted in the organic compound layer. Here, a reflectance for light having a wavelength of 460 nm, the light showing a blue color, is evaluated.

Meanwhile, the work function of a metal element constituting a metal material to be used as a constituent material for the lower electrode 21 is also a factor that affects the charge injection property of the lower electrode 21. Here, Table 2 below shows the work functions of metal elements (Al, Nd, Y, Si, Pt, Ni, Mo, and W) constituting the metal materials shown in Table 1.

TABLE 2

| Metal element | Work function [eV] |
| --- | --- |
| Al | 4.3 |
| Nd | 3.2 |
| Y | 3.0 |
| Si | 4.6 |
| Pt | 5.2 |
| Ni | 5.1 |
| Mo | 4.6 |
| W | 4.6 |

As shown in Table 1 and Table 2, when an aluminum alloy (Al alloy) obtained by combining Al and a metal element having a smaller work function than that of Al is used as an electrode material, the driving voltage increases as compared with that in the case of Al. On the other hand, when an Al alloy obtained by combining Al and a metal element having a larger work function than that of Al is used as an electrode material, the driving voltage reduces as compared with that in the case of Al. The following phenomenon is considered as the reason why the driving voltage of the organic EL element 20 changes depending on a metal element to be combined with Al as described above. An element having a small work function has high reactivity with $O_2$ (easily oxidizes), and an oxide produced by the reaction with $O_2$ has so high an electric resistance as to inhibit the injection of charge. The inhibition of the injection of the charge from an electrode into the organic compound layer increases the driving voltage of the organic EL element 20. It is assumed from the foregoing that when an electrode material having a small work function is used, the surface of the lower electrode is oxidized by the photolithography process performed in the air to inhibit the injection of the charge, and hence the driving voltage of the organic EL element 20 increases.

By the foregoing reason, the work function of a metal material serving as a constituent material for the second lower electrode layer 21b is made larger than the work function of a metal material serving as a constituent material for the first lower electrode layer 21a in order that the charge injection property in the second lower electrode layer 21b may be made larger than that in the first lower electrode layer 21a. Here, when a metal material is an alloy, the work function of the metal material is determined by: calculating the product of the work function of a metal element constituting the alloy and the blending ratio of the metal element for each metal element; and finally summing the products.

Here, in the present invention, the work function of a metal element having the smallest work function out of metal elements in the first lower electrode layer 21a is preferably made smaller than that of a metal element having the largest work function out of metal elements in the second lower electrode layer 21b. With this, the charge injection property of the second lower electrode layer 21b enlarges.

In addition, an oxidation treatment to be frequently used in a pretreatment step for an anode substrate can be suitably used as a method of controlling the charge injection property of each lower electrode layer.

When constituent materials for the two layers constituting the lower electrode 21, i.e., the first lower electrode layer 21a and the second lower electrode layer 21b are investigated in consideration of the matters described in the foregoing, in particular, Table 1, it can be said that the constituent materials are preferably selected as shown in, for example, Table 3 below in consideration of the fact that a material having a higher reflectance is more suitable for the first lower electrode layer 21a.

TABLE 3

| First lower electrode layer | Al, AlNd, or AlY |
|---|---|
| Second lower electrode layer | AlSi, AlPt, AlNi, Mo, or W |

Here, a constituent material for the first lower electrode layer 21a shown in Table 3 is a material that is relatively easily oxidized as compared with a constituent material for the second lower electrode layer 21b. As a result, the injection of charge from the first lower electrode layer into the organic compound layer is suppressed.

It should be noted that the constituent materials for the respective lower electrode layers (21a and 21b) shown in Table 3 are merely specific examples, and the present invention is not limited thereto.

In other words, the constituent material for the first lower electrode layer 21a is not limited to Al, AlNd, and AlY in Table 3 as long as the material easily oxidizes as compared with the constituent material for the second lower electrode layer 21b, and the material may be any other Al alloy that easily oxidizes. Alternatively, Ag and an Ag alloy as metal materials that easily oxidize as in the case of the Al alloy may each be used.

Meanwhile, the constituent material for the second lower electrode layer 21b is not limited to AlSi, AlPt, AlNi, Mo, and W in Table 3 as long as the material hardly oxidizes as compared with the constituent material for the first lower electrode layer 21a. Specifically, the second lower electrode layer 21b is a layer formed of a metal that hardly oxidizes, a layer formed of a material that has conductivity even after its oxidation such as Mo or W, or a conductive oxide layer.

The thickness of the second lower electrode layer 21b is preferably smaller than that of the first lower electrode layer 21a. Here, when the second lower electrode layer 21b is formed to be thin, in the case where the lower electrode 21 and the organic compound layer 22 are in contact with each other at an end portion of the lower electrode 21, an area of contact between the second lower electrode layer 21b and the organic compound layer 22 reduces. As a result, the flow of a current from an end portion of the second lower electrode layer 21b can be effectively suppressed. Specifically, the thickness of the second lower electrode layer 21b is preferably one half or less, more preferably one third or less of the thickness of the first lower electrode layer 21a.

In addition, when the reflectance of the second lower electrode layer 21b is lower than that of the first lower electrode layer 21a, the second lower electrode layer 21b is preferably formed to be so thin that light permeates the layer.

A known method such as a sputtering method or a vacuum vapor deposition method can be adopted as a method of forming each of the first lower electrode layer 21a and the second lower electrode layer 21b as two layers constituting the lower electrode 21. It should be noted that in this embodiment, upon formation of the respective lower electrode layers, the layers are desirably formed in a continuous fashion without being exposed to the air in order that an interface between the first lower electrode layer and the second lower electrode layer may not be oxidized.

After the formation of the lower electrode 21, the organic compound layer 22 is formed. Here, a known low-molecular-weight material or a known polymeric material can be selected as a constituent material for the organic compound layer 22. In addition, the organic compound layer is an emission layer alone or a laminate formed of multiple layers having at least the emission layer. Here, when the organic compound layer 22 is formed of multiple layers, a layer except the emission layer constituting the organic compound layer is, for example, a hole transport layer, a hole injection layer, an electron transport layer, or an electron injection layer.

After the formation of the organic compound layer 22, the upper electrode 23 is formed. Here, a constituent material for the upper electrode 23 is not particularly limited as long as the electrode is a layer formed of a conductive material that does not do damage to the previously formed organic compound layer 22 at the time of the formation of the electrode. Examples of the constituent material for the upper electrode 23 include: a metal material such as Al or Ag; and a transparent electrode material such as ITO or zinc oxide to which tin has been added. In addition, the upper electrode 23 may be constituted of one layer, or may be constituted of multiple layers. Here, when the upper electrode 23 is constituted of multiple layers, a laminated electrode layer constituted by laminating a layer formed of the metal material and a layer formed of the transparent electrode material can be used as the upper electrode.

(2) Second Embodiment

Figure 2:
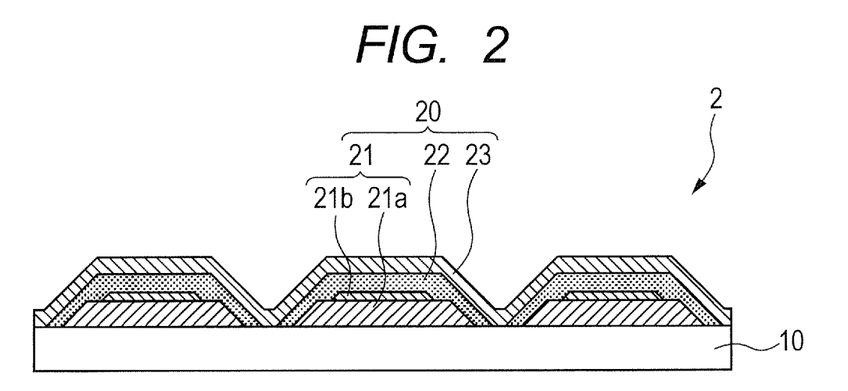
FIG. 2 is a schematic sectional view illustrating a display device according to Second Embodiment of the present invention.

FIG. 2 is a schematic sectional view illustrating a display device according to Second Embodiment of the present invention. In a display device 2 of FIG. 2, the same component as that of the display device 1 of FIG. 1 is represented by the same reference symbol. As compared with the display device 1 of FIG. 1, the display device 2 of FIG. 2 is different from the display device 1 of FIG. 1 in that a lower end portion of the second lower electrode layer 21b is placed in a plane region so as not to coincide with an upper end portion of the first lower electrode layer 21a.

Here, the first lower electrode layer 21a and the second lower electrode layer 21b illustrated in FIG. 2 are each individually formed by using a photolithography process (a processing process for an electrode layer formed of a photolithography method and etching). In other words, the lower electrode 21 constituting the display device of this embodiment is formed by using the photolithography process twice. That is, this embodiment is utilized particularly when the two kinds of lower electrode layers (21a and 21b) are formed under different conditions.

(3) Third Embodiment

In the display device of the present invention, the step of treating the surface of the lower electrode 21 may be provided between the performance of patterning based on the photolithography process after the formation of the lower electrode 21 and the initiation of the formation of the organic compound layer 22.

Here, a method of treating the surface of the lower electrode 21 is, for example, a surface treatment involving using phosphoric acid (phosphoric acid treatment) or a surface treatment involving using oxygen turned into plasma ($O_2$ plasma treatment).

Here, part of the electrode materials listed in Table 1 were subjected to an experiment concerning a surface treatment for the lower electrode 21.

Specifically, first, a lower electrode was formed with an electrode material shown in Table 4 below. After that, the lower electrode was subjected to the following surface treatments.

(A) Phosphoric Acid Treatment

An 11% aqueous solution of phosphoric acid was prepared and then a substrate with the lower electrode was immersed in the aqueous solution of phosphoric acid for 4 minutes.

(B) O$_2$ Plasma Treatment

The substrate with the lower electrode subjected to the phosphoric acid treatment was exposed under an O$_2$ plasma environment for 30 seconds.

After the surface treatments described in the sections (A) and (B) had been performed, an organic EL element was produced by forming an organic compound layer and an upper electrode on the lower electrode in the stated order, and then each produced organic EL element was evaluated for a voltage needed to drive the element at a current density of 25 mA/cm$^2$. Table 4 shows the results.

TABLE 4

| | Driving voltage at 25 mA/cm$^2$ [V] | | |
|---|---|---|---|
| Electrode material | Before surface treatments | After phosphoric acid treatment | After O$_2$ plasma treatment |
| Al | 6.5 | 3.7 | 6.5 |
| AlNd | 6.7 | 3.7 | 6.7 |
| AlSi | 4.2 | 3.7 | 3.7 |
| Mo | 3.7 | 3.7 | 3.7 |

First, at the stage where the phosphoric acid treatment was performed, the driving voltage of an organic EL element produced by using an electrode material except Mo (Al, AlNd, or AlSi) tended to reduce. This is because a natural oxide film formed on the surface of Al or an Al alloy was removed by the phosphoric acid treatment. It should be noted that it may be because the natural oxide film formed on the surface of Al or the Al alloy did not occur on the surface of Mo that the phosphoric acid treatment caused no change in driving voltage when Mo was used as an electrode material.

Next, at the stage where the O$_2$ plasma treatment was performed, when Al or AlNd was selected as an electrode material for the lower electrode, the driving voltage of the produced organic EL element increased by nearly 3 V as compared with that before the treatment. In contrast, when AlSi or Mo was selected as an electrode material for the lower electrode, the driving voltage of the produced organic EL element remained nearly unchanged as compared with that before the treatment. The results mean that while Al or AlNd is a material whose surface is easily oxidized by the O$_2$ plasma (such a material that aluminum oxide is easily produced), AlSi is a material whose surface is hardly oxidized by the O$_2$ plasma. It should be noted that when Mo is selected as an electrode material, the surface of the electrode is oxidized as in the case of Al or an Al alloy by performing the O$_2$ plasma treatment. However, there is nearly no difference between the driving voltages before and after the O$_2$ plasma treatment because a molybdenum oxide has conductivity unlike aluminum oxide.

In consideration of the foregoing, it is preferred that Al or AlNd be used as the constituent material for the first lower electrode layer 21a having relatively small charge injection property out of the constituent layers for the lower electrode 21, and AlSi or Mo be selected as the constituent material for the second lower electrode layer 21b having relatively large charge injection property. In this case, the injection of charge from the first lower electrode layer 21a into the organic compound layer 22 is suppressed by performing the phosphoric acid treatment and the O$_2$ plasma treatment in the stated order after the formation of the lower electrode 21 and before the performance of the step of forming the organic compound layer 22. That is, charge transported to the lower electrode 21 is injected from the second lower electrode layer 21b into the organic compound layer 22 selectively.

As described above, the lower electrode 21 is formed by using a material that is hardly oxidized by an oxidant for the second lower electrode layer 21b while using a material that is easily oxidized by an oxidant for the first lower electrode layer 21a. In this case, an additionally large difference can be made between the electron injection properties of the electrode layers (21a and 21b) constituting the lower electrode by performing a surface oxidation treatment with O$_2$ plasma or the like before the formation of the organic compound layer 22. Accordingly, the injection of charge from an end portion of the first lower electrode layer can be suppressed.

It should be noted that the constituent material for the first lower electrode layer 21a is not limited to Al and AlNd, and any other Al alloy that easily oxidizes, and Ag and an Ag alloy that easily oxidize as in the case of Al may each be used. In addition, the constituent material for the second lower electrode layer 21b is not limited to AlSi, and a metal that hardly oxidizes, a metal that has conductivity even after its oxidation such as Mo or W, or a conductive oxide is also permitted.

Next, the present invention is described by way of examples. However, the present invention is not limited to these examples.

EXAMPLE 1

FIGS. 3A to 3G are schematic sectional views illustrating a production process for a display device in this example (Example 1). Hereinafter, a method of producing the display device in this example is described with reference to FIGS. 3A to 3G.

(1) Step of Forming Lower Electrode

Figure 3A:
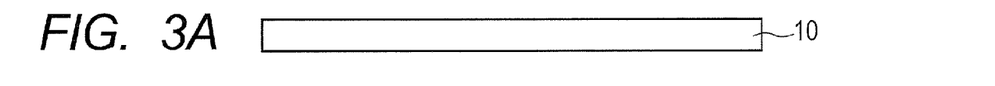
FIGS. 3A, 3B, 3C, 3D, 3E, 3F, and 3G are schematic sectional views illustrating a production process for a display device in Example 1.
Figure 3B:
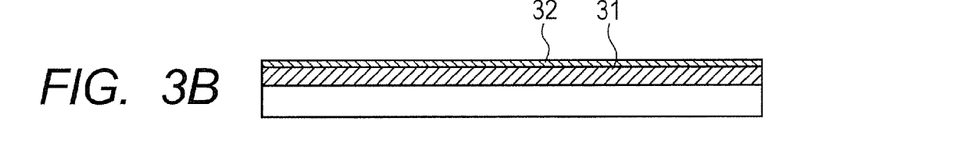

First, an AlNd alloy was formed on a glass substrate (the substrate 10 illustrated in FIG. 3A) by a sputtering method. Thus, an AlNd layer 31 (first lower electrode layer) was formed (FIG. 3B). At this time, the thickness of the AlNd layer 31 was set to 30 nm. Next, an AlSi alloy was formed on the AlNd layer 31 by the sputtering method. Thus, an AlSi layer 32 (second lower electrode layer) was formed (FIG. 3B). At this time, the thickness of the AlSi layer 32 was set to 10 nm.

Figure 3C:
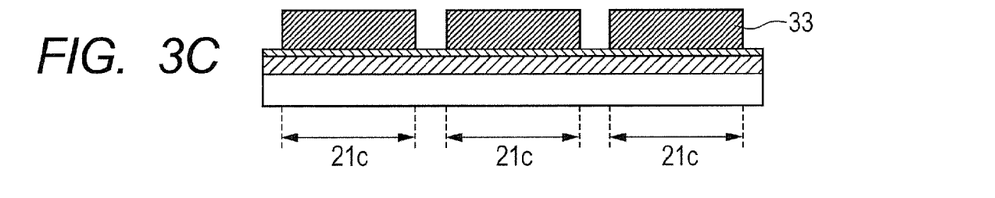

Next, a positive resist (AZ1500 manufactured by AZ) was applied onto the entire surface of the AlSi layer 32 by a spin coating method to form a resist layer. At this time, the thickness of the resist layer was 1 μm. Next, a region where the lower electrode 21 was to be formed was masked and the other region was exposed to UV light with an exposing device MPA600 manufactured by Canon Inc. Next, the resist layer formed in the exposed region was removed by developing the exposed region with a resist developer (a 50% aqueous solution of a 312MIF solution manufactured by AZ). Thus, resist layers 33 subjected to patterning along regions 21c where the lower electrodes 21 were to be provided were formed (FIG. 3C).

Figure 3D:
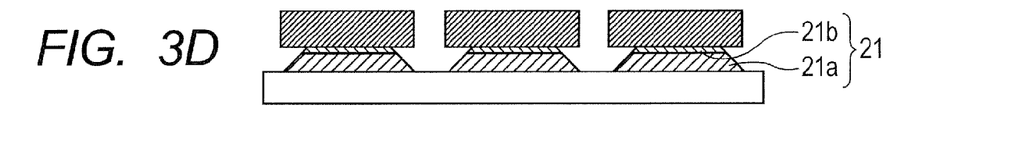

Next, the substrate 10 provided with the AlNd layer 31, the AlSi layer 32, and the resist layers 33 was immersed in a mixed liquid formed of phosphoric acid, nitric acid, and acetic acid for 2 minutes. Thus, the AlNd layer 31 and the AlSi layer 32 formed in the region where the resist layers 33 were not provided were partially removed, and as a result, the AlNd layer 31 and the AlSi layer 32 were processed. Through the foregoing process, the lower electrodes 21 each formed of the processed AlNd layer 31 and the processed AlSi layer 32 were obtained (FIG. 3D). It should be noted that the processed AlNd layer 31 functions as the first lower electrode layer 21a and the processed AlSi layer 32 functions as the second lower electrode layer 21b. In addition, in the wet etching performed with the mixed liquid, the Al alloys (the AlNd alloy and the AlSi alloy) are dissolved from the region where the resist layers 33 are not provided in an isotropic fashion. Accordingly, the sectional shape of an end portion of the lower electrode 21 was a taper shape and the taper angle of the lower electrode 21 formed by the etching under the condition was 45°.

Figure 3E:
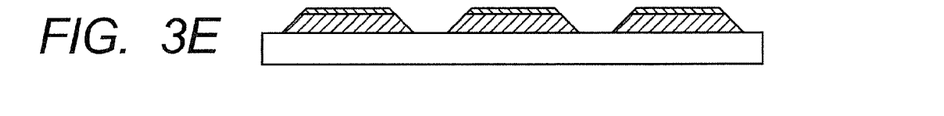

Next, the patterned lower electrodes 21 were exposed by subjecting the remaining resist layers 33 to a peeling treatment with a resist peeling liquid (FIG. 3E).

(2) Step of Forming Organic Compound Layer

Figure 3F:
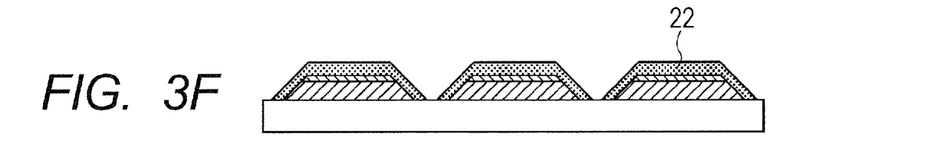

Next, the organic compound layer 22 formed of a hole transport layer, an emission layer, and an electron transport layer was formed on the lower electrode 21 by a vacuum vapor deposition method (FIG. 3F). It should be noted that upon formation of the organic compound layer 22, the layer was formed so as to cover the end portions of the lower electrode 21, i.e., the end portions including the upper end portions, side walls, and lower end portions of the respective layers (21a and 21b) constituting the lower electrode. Hereinafter, a specific method of forming the organic compound layer 22 in this example is described.

First, the hole transport layer was formed with Compound 1 shown below on the lower electrode 21. At this time, the thickness of the hole transport layer was set to 100 nm, a degree of vacuum was set to $1 \times 10^{-4}$ Pa, and a vapor deposition rate was set to 0.2 nm/sec.

Compound 1

Next, Compound 2 shown below as a host and Compound 3 shown below as a guest were co-deposited from the vapor at a weight ratio of 80:20 onto the hole transport layer to form the emission layer. At this time, the following conditions were adopted: the thickness of the emission layer was set to 35 nm, a degree of vacuum at the time of the vapor deposition was set to $1 \times 10^{-4}$ Pa, and a formation rate was set to 0.1 nm/sec. It should be noted that the formed emission layer is an emission layer that emits blue light.

Compound 2

-continued

Compound 3

Next, a compound shown below was deposited from the vapor in a vacuum onto the emission layer to form the electron transport layer. At this time, the following conditions were adopted: the thickness of the electron transport layer was set to 10 nm, a degree of vacuum at the time of the vapor deposition was set to $1 \times 10^{-4}$ Pa, and a formation rate was set to 0.1 nm/sec.

(3) Step of Forming Upper Electrode

Figure 3G:
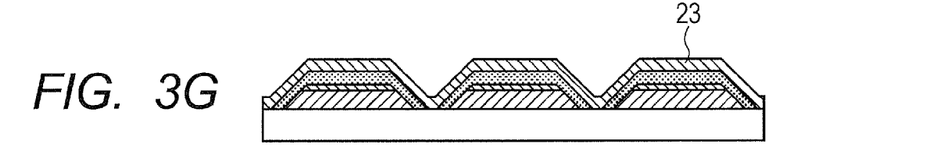

Next, an AgMg alloy was formed on the organic compound layer 22 by the vacuum vapor deposition method. Thus, the upper electrode 23 was formed (FIG. 3G). At this time, the thickness of the upper electrode 23 was set to 20 nm.

(4) Sealing Step

Finally, the resultant was sealed with a glass cap. Thus, a display device having multiple organic EL elements, specifically, the display device 1 illustrated in FIG. 1 was obtained.

(5) Evaluation of Display Device

The resultant display device was evaluated as described below. A voltage was applied to the electrodes in the display device to cause an organic EL element provided for the display device to emit light. As a result, it was found that while the element strongly emitted light in the plane region of the second lower electrode layer 21b in FIG. 1, the element emitted nearly no light in the end portion region of the first lower electrode layer 21a. In addition, the display device obtained in this example emitted even, uniform light when driven.

EXAMPLE 2

FIGS. 4A to 4J are schematic sectional views illustrating a production process for a display device in this example (Example 2). Hereinafter, a method of producing the display device in this example is described with reference to FIGS. 4A to 4J. In should be noted that the same constituent component as that illustrated in FIGS. 3A to 3G is represented by the same reference symbol.

(1) Step of Forming Lower Electrode

Figure 4A:
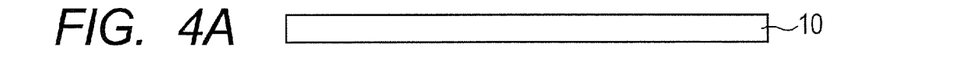
FIGS. 4A, 4B, 4C, 4D, 4E, 4F, 4G, 4H, 4I, and 4J are schematic sectional views illustrating a production process for a display device in Example 2.
Figure 4B:
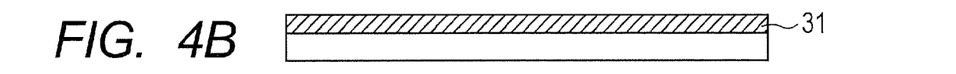

First, the AlNd layer 31 formed of an AlNd alloy was formed on a glass substrate (the substrate 10 illustrated in FIG. 4A) by a sputtering method (FIG. 4B). At this time, the thickness of the AlNd layer 31 was set to 30 nm.

Figure 4C:
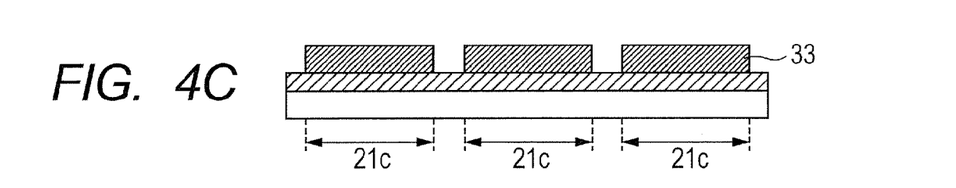
Figure 4D:
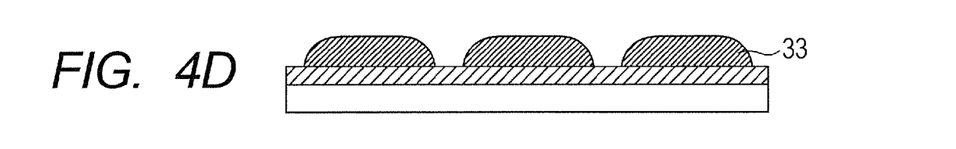
Figure 4E:
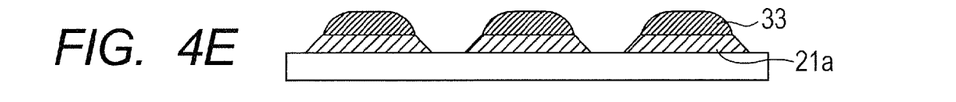

Next, a positive resist (AZ1500 manufactured by AZ) was applied onto the entire surface of the AlNd layer 31 by a spin coating method to form a resist layer. At this time, the thickness of the resist layer was 1 μm. Next, a region where the lower electrode 21 was to be formed was masked and the other region was exposed to UV light with an exposing device MPA600 manufactured by Canon Inc. Next, the resist layer formed in the exposed region was removed by developing the exposed region with a resist developer (a 50% aqueous solution of a 312MIF solution manufactured by AZ) for 1 minute. Thus, the resist layers 33 subjected to patterning along the regions 21c where the lower electrodes 21 were to be provided were formed (FIG. 4C). Next, the sectional shapes of the upper end portions of the resist layers 33 were roundly deformed as illustrated in FIG. 4D by heating the resist layers 33 at 120° C. for 1 minute. Next, etching was performed with an RIE device and Cl as a reactant gas for 3 minutes under the conditions of a flow rate of 20 sccm, a pressure of 1 Pa, and an output of 100 W. The etching (dry etching) removed the AlNd layer 31 formed in the region where the resist layers 33 were not provided, thereby processing the AlNd layer 31 (FIG. 4E). It should be noted that the processed AlNd layer 31 functions as the first lower electrode layer 21a.

Figure 4F:
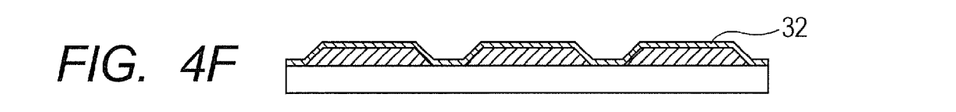

Next, the AlSi layer 32 was formed on the substrate 10 and the first lower electrode layer 21a by the sputtering method (FIG. 4F). At this time, the thickness of the AlSi layer 32 was set to 10 nm.

Figure 4G:
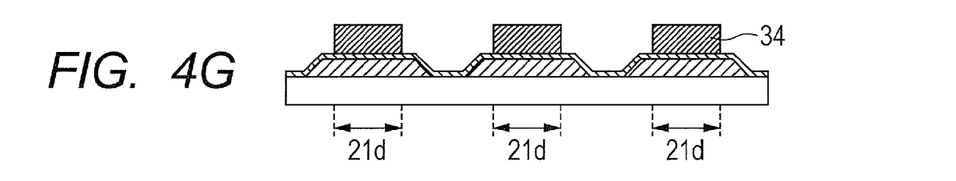
Figure 4H:
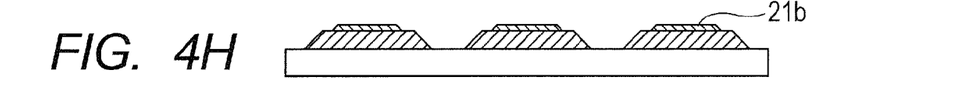

Next, a positive resist (AZ1500 manufactured by AZ) was applied onto the entire surface of the AlSi layer 32 to form a resist layer. At this time, the thickness of the resist layer was 1 μm. Next, a region where the second lower electrode layer 21b was to be provided was masked and the other region was exposed to UV light with an exposing device MPA600 manufactured by Canon Inc. Next, the resist layer formed in the exposed region was removed by developing the exposed region with a resist developer (a 50% aqueous solution of a 312MIF solution manufactured by AZ) for 1 minute. Thus, resist layers 34 subjected to patterning along regions 21d where the second lower electrode layers 21b were to be provided were formed (FIG. 4G). Next, etching was performed with an RIE device and Cl as a reactant gas for 1 minute under the conditions of a flow rate of 20 sccm, a pressure of 1 Pa, and an output of 100 W. The etching (dry etching) removed the AlSi layer 32 formed in the region where the resist layers 34 were not provided, thereby processing the AlSi layer 32 (FIG. 4H). It should be noted that the processed AlSi layer 32 functions as the second lower electrode layer 21b.

Through the foregoing process, the lower electrodes 21 each formed of the first lower electrode layer 21a and the second lower electrode layer 21b were formed in a desired pattern shape.

(2) Step of Forming Organic Compound Layer

Figure 4I:
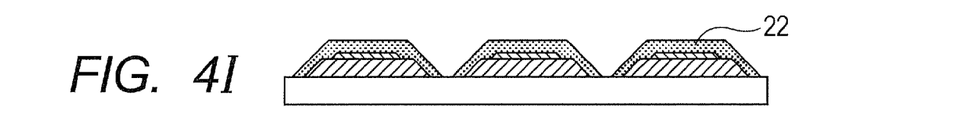

Next, the organic compound layer 22 formed of a hole transport layer, an emission layer, and an electron transport layer was formed on the lower electrode 21 by a vacuum vapor deposition method (FIG. 4I). It should be noted that upon formation of the organic compound layer 22, the layer was formed so as to cover the end portions of the lower electrode 21, i.e., the end portions including the upper end portions, side walls, and lower end portions of the respective layers (21a and 21b) constituting the lower electrode. Hereinafter, a specific method of forming the organic compound layer 22 in this example is described.

First, the hole transport layer formed of Compound 1 shown below was formed on the lower electrode 21. At this time, the thickness of the hole transport layer was set to 100 nm, a degree of vacuum was set to $1\times10^{-4}$ Pa, and a vapor deposition rate was set to 0.2 nm/sec.

Compound 1

Next, Compound 2 shown below as a host and Compound 3 shown below as a guest were co-deposited from the vapor at a weight ratio of 80:20 onto the hole transport layer to form the emission layer. At this time, the following conditions were adopted: the thickness of the emission layer was set to 35 nm, a degree of vacuum at the time of the vapor deposition was set to $1\times10^{-4}$ Pa, and a formation rate was set to 0.1 nm/sec. It should be noted that the formed emission layer is an emission layer that emits blue light.

Compound 2

Compound 3

Next, a compound shown below was deposited from the vapor in a vacuum onto the emission layer to form the electron transport layer. At this time, the following conditions were adopted: the thickness of the electron transport layer was set to 10 nm, a degree of vacuum at the time of the vapor deposition was set to $1\times10^{-4}$ Pa, and a formation rate was set to 0.1 nm/sec.

(3) Step of Forming Upper Electrode

Figure 4J:
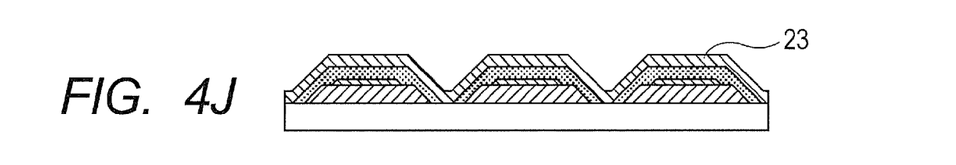

Next, a layer formed of an AgMg alloy was formed on the organic compound layer 22 by the vacuum vapor deposition method. Thus, the upper electrode 23 was formed (FIG. 4J). At this time, the thickness of the upper electrode 23 was set to 20 nm.

(4) Sealing Step

Finally, the resultant was sealed with a glass cap. Thus, a display device having multiple organic EL elements, specifically, the display device 2 illustrated in FIG. 2 was obtained.

(5) Evaluation of Display Device

The resultant display device was evaluated as described below. A voltage was applied to the electrodes in the display device to cause an organic EL element provided for the display device to emit light. As a result, it was found that while the element strongly emitted light in the plane region of the second lower electrode layer 21b in FIG. 2, the element emitted nearly no light in the end portion region of the first lower electrode layer 21a. In addition, the display device obtained in this example emitted even, uniform light when driven.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2011-262265, filed Nov. 30, 2011, which is hereby incorporated by reference herein in its entirety.

What is claimed is:

1. A display device comprising:
    a substrate; and
    multiple pixels provided on the substrate, the pixels each having an organic electroluminescence element obtained by laminating a lower electrode provided on the substrate, an organic compound layer, and an upper electrode in the stated order, and the lower electrode comprising an electrode independently placed on the substrate for each of the pixels,
    wherein the lower electrode comprises a first lower electrode layer provided on the substrate and a second lower electrode layer provided in a region on the first lower electrode layer, the region excluding an end portion;
    wherein the organic compound layer covers and makes contact with the first lower electrode layer and the second lower electrode layer;
    wherein the upper electrode covers the organic compound layer; and
    wherein charge injection property from the second lower electrode layer into the organic compound layer is larger than charge injection property from the first lower electrode layer into the organic compound layer.

2. The display device according to claim 1, wherein a metal element having a smallest work function out of metal elements in the first lower electrode layer has a smaller work function than that of a metal element having a largest work function out of metal elements in the second lower electrode layer.

3. The display device according to claim 1, wherein the first lower electrode layer is formed of one of Al and an Al alloy containing Al and a metal element having a smaller work function than that of Al; and
    wherein the second lower electrode layer is formed of an Al alloy containing Al and a metal element having a larger work function than that of the metal element in the first lower electrode layer.

4. The display device according to claim 1, wherein the sectional shape of an end portion of the lower electrode is a taper shape.

5. The display device according to claim 4, wherein the second lower electrode is provided at a region in which the first lower electrode is not inclined.

6. The display device according to claim 1, wherein the thickness of the second lower electrode layer is smaller than that of the first lower electrode layer.

7. The display device according to claim 1, wherein the first lower electrode layer is formed of at least one of Al, an Al alloy, Ag and an Ag alloy;
    wherein the second lower electrode layer is formed of at least one of AlSi, Mo and W; and
    wherein the surface of the lower electrode is oxidized.

8. The display device according to claim 1, wherein the organic compound layer includes at least an emission layer.

9. The display device according to claim 8, wherein the organic compound layer further includes at least one layer selected from a hole transport layer, a hole injection layer, an electron transport layer, and an electron injection layer.

* * * * *